United States Patent [19]

Shiloh et al.

[11] Patent Number: 5,410,801
[45] Date of Patent: May 2, 1995

[54] APPARATUS FOR MANUALLY CONTROLLED PLACEMENT OF COMPONENTS ON CIRCUIT BOARDS

[75] Inventors: Avraham Shiloh; Peretz J. Shiloh; Adam Shiloh, all of Huntingdon Valley; Steven R. Evers, Feasterville, all of Pa.

[73] Assignee: Automated Production Systems, Huntingdon Valley, Pa.

[21] Appl. No.: 14,544

[22] Filed: Feb. 8, 1993

[51] Int. Cl.$^6$ .................................... H05K 13/00
[52] U.S. Cl. ...................... 29/740; 29/743; 29/759
[58] Field of Search ............... 29/740, 741, 743, 759

[56] References Cited

U.S. PATENT DOCUMENTS

| | | |
|---|---|---|
| 3,337,941 | 8/1967 | Drop . |
| 3,453,714 | 7/1969 | Clark et al. . |
| 4,843,711 | 7/1989 | Rager .................................. 29/740 |
| 4,858,308 | 8/1989 | Komori ................................ 29/740 |
| 4,872,258 | 10/1989 | Ragard ................................ 29/740 |
| 4,951,388 | 8/1990 | Eguchi et al. ...................... 29/832 |
| 4,979,286 | 12/1990 | Nakayama et al. ................. 29/740 |
| 4,985,986 | 1/1991 | Fritsch ............................... 29/740 |
| 5,060,366 | 10/1991 | Asai et al. .......................... 29/739 |
| 5,093,984 | 3/1992 | Lape .................................. 29/741 |

*Primary Examiner*—Carl E. Hall
*Attorney, Agent, or Firm*—Eckert Seamans Cherin & Mellott

[57] ABSTRACT

A pick and place device for populating a circuit board is operated manually. One or more pickup heads in a carriage is lowered to engage a component by vacuum, raised for carrying the component to a desired position over the circuit board and lowered to set the component. The component can be rotated, and the vacuum is operated automatically during pick and place movements, accomplished with one hand via a rotatable handle arrangement. A hand rest places the user's fingers in range of the handle and assists in coarse positioning of the carriage. The handle and hand rest are mountable on opposite lateral sides of the carriage head assembly. Finger controlled fine positioning guides also support the carriage for movement relative to the coarse guide. Coarse guidance is by a telescoping arm and lateral rail or the like. Fine guidance is by a short span two-axis slide block coupling the carriage to the telescoping arm. The handle lifts or lowers a control plate and is coupled to convey rotation. A number of pickup heads can be carried in a turret that indexes to bring them into position where a contact member conveys rotation and moves the pickup head axially. Each pickup head has an individual control for coupling to the vacuum, including a push-on, push-off switch operated with movement of the control plate.

20 Claims, 12 Drawing Sheets

APPARATUS FOR MANUALLY CONTROLLED PLACEMENT OF COMPONENTS ON CIRCUIT BOARDS

BACKGROUND OF THE INVENTION

1. Field of the Invention

This invention relates to methods and apparatus for mounting electronic components on printed circuit boards. In particular, surface mounting of circuit board components is effected using a manually operable mounting head, specifically structured such that all the movements of the mounting head necessary to place the components can be accomplished by the user with one hand.

2. Prior Art

Electronic circuits are mounted on printed circuit boards having a pattern of conductors on an insulating surface or substrate. Various electronic components are arranged on the surface such that individual leads of the components correspond in position to the conductors, and can be electrically coupled into a circuit by soldering. Surface mounted devices (or "SMDs") are soldered to conductor pads or "lands" that lay flat on the surface of the printed circuit board. Other types of packages, such as the dual-in-line package, have protruding leads that are intended to extend into holes in the printed circuit board at the lands. In either case, leads of the mounted package are coupled into a circuit by conductors that extend along the surface of the board and may be coupled to additional conductors on the opposite surface or at a different level.

A circuit package having protruding leads must be positioned accurately such that the leads align with the holes in the circuit board, permitting the leads to be inserted. SMDs also must be positioned accurately, so that their conductive leads, generally terminating in small pads around the lower peripheral edge of the SMD, rest on the corresponding lands of the printed circuit board. Such positioning can be demanding for protruding leads, because a missed insertion will bend one or more leads. The positioning is also demanding for SMDs, especially because the pads and lands are very small and very closely spaced, such that a minimal error can cause solder bridges to be formed, shorting between adjacent pads and/or lands.

SMDs have developed in response to a need to mount components and conductors more closely and densely on circuit boards, for compactness and also to shorten the length of conductors between circuit elements for improved speed and electrical properties in the circuit as a whole. The leads of an SMD can terminate on the surface of the SMD package in a so-called "leadless" configurations. In that case conductors to the circuit element or elements in the SMD package are coupled to conductors presented on the surface of the package. SMDs also may have leads that extend outwardly from the surface of the SMD package. However, unlike devices having leads that are inserted into holes in the circuit board, such "leaded" SMD packages simply rest on the surface of the circuit board, where the leads are soldered to lands that correspond in spacing to the leads. For purposes of this disclosure, an SMD device is construed to include a surface mounted receptacle having conductors for coupling width a device received in the receptacle. The receptacle may have other means such as spring biased conductors or clamps for coupling electrically to the device received in the receptacle.

Components can be positioned on a board by hand. However, this is a most laborious and exacting process. The components, such as delicate SMDs, can be damaged by manual handling. To address mounting problems, a variety of automatic and semiautomatic apparatus have been developed to more efficiently assemble circuit boards.

It is known to mount SMDs and the like using a vacuum-assisted mounting head. The head picks up the SMD (for example an integrated circuit with a plurality of leads), and holds the SMD adjacent a vacuum inlet. After moving the head to the required position the vacuum is released, detaching the SMD from the head, hopefully as accurately positioned over the corresponding lands on the circuit board.

Various structures can be used in picking up, placing and releasing an SMD or the like. An apparatus having a single mounting head that is movable between a pickup position and a placement position is disclosed, for example, in U.S. Pat. No. 4,872,258—Ragard. U.S. Pat. No. 5,093,984—Lape discloses an apparatus arranged to displace a mounting head in a first direction and to displace the circuit board in a direction perpendicular thereto, to effect X-Y positioning of a component relative to the circuit board.

Multi-head devices provide further alternatives for positioning SMDs. A plurality of mounting heads can be arranged around a rotatable turret. A mounting head on the turret is lowered in a direction parallel to the turret rotation axis to engage an SMD at a first position angular position around the turret, then raised and rotated with the turret to a second angular position where the SMD is deposited on the circuit board. A multi-head device of this type is disclosed in U.S. Pat. No. 4,979,286—Nakayama et al. A rotatable multi-head turret also can be combined with a further positioning mechanism for providing X-Y positioning, for example as disclosed in U.S. Pat. No. 4,985,986—Fritsch.

Movement of one of the heads around the turret results in rotation of the device carried in the head. It is necessary to align the SMD or other device rotationally as well as to move the device to the required X-Y location on the board. U.S. Pat. No. 4,979,286—Nakayama et al discloses a mounting head mechanism having a head rotation drive mechanism that rotates a selected mounting head about its own axis so as to angularly position the SMD prior to placement on the circuit board.

Prior art positioning systems for SMDs and similar circuit components generally are complicated and expensive electromechanical robotic devices. Such devices may be suitable for large scale production lines where they can repetitively place components on circuit boards according to a rigid program that defines all the steps and positioning movements needed to place a component on the circuit board. It would be advantageous, however, to provide a positioning mechanism that is more appropriate for smaller and more customized production runs, that is substantially lower in cost, is manually operated, and is capable of versatile and accurate component placement at a reasonable speed. Such a device advantageously would take advantage of the aspect of typical circuits that a number of identical resistors, capacitors or other components are used at various locations on the board, and would be arranged for efficient operation under manual control of an operator, to achieve the greatest possible efficiency of the operator, i.e., to very accurately and inexpensively place the maximum number of components on circuit boards in the minimum amount of time.

SUMMARY OF THE INVENTION

It is an object of this invention to provide an inexpensive, manually operated positioning apparatus for use in mounting components on circuit boards.

It is another object to provide an apparatus for positioning electronic components on a circuit board, which apparatus has a mounting head with a number of degrees of freedom, and is preferably manipulated with one hand.

It is a further object of the invention to provide a coarse positioning guide for moving a positioning device over a large field in a plane, coupled to a fine positioning guide movable in the same plane, the coarse and fine positioning guides being coupled but operable independently, whereby fine movements within the span of the fine positioning guide are accomplished more quickly than would be possible in a device capable of spanning the entire field.

It is another object of the invention in connection with coupled coarse/fine positioning guides as described, to support the arm and hand of a user on an element positioned by the coarse positioning guide, whereby hand and finger movements by the user control displacement within the span of the fine positioning guide, permitting fast and accurate placement of components on a circuit board.

It is yet another object of the invention to provide such a pick-and-place positioning device wherein the mountings are readily reversed to accommodate right handed and left handed operators.

Another object of the invention is to provide movable receptacles for components to be chosen and placed in a pick-and-place apparatus, especially to position a supply of components within the span of a fine positioning apparatus, such that repetitive pick-and-place operations can be accomplished manually at maximum speed.

It is still another object of the invention to arrange a manually operable positioning apparatus with a number of independently operable pickup heads, each being selectively movable into an operative position and having a capability to select and hold a component until that pickup head is again selected for placement of the component.

These and other objects are accomplished in a positioning apparatus for mounting components on a circuit board according to the present invention. The apparatus enables accurate positioning and can be operated manually with one hand. A vacuum-assisted mounting head is carried in a mounting head assembly for temporary engagement with the component to be mounted on the circuit board, and may have plural pickup heads with independent controls for holding the components, whereby the pickup heads can carry a number of components at the same time, to the general area where they will be placed. A fine positioning guide assembly is carried on the end of a coarse positioning guide assembly. A handle attached on one side of the mounting head assembly is used for finger control of horizontal movement of the mounting head within the span of the fine positioning guide, each of the coarse and fine guides positioning the device at a selected position in a plane parallel to and above the circuit board by an X-Y, polar or other positioning guide arrangement. The mounting head assembly is supported by a means for fine horizontal positioning over a limited span, attached to an end of a support arm that is positioned by a coarse positioning means encompassing a large span. The coarse span covers the area of the circuit board, and preferably also peripheral areas where components may be kept and selected for pickup by the operator.

The coarse positioning means has a hand rest attached thereto, allowing the operator to bring the mounting head assembly into the area where components are to be mounted, using hand and arm movements of the operator. When thereby generally in place, however, the fine positioning means allows the operator to make fast, short and accurate adjustments, using hand and finger movements, to precisely set the components. Preferably, the components are stored in movable bins that are arranged to slide or roll on peripheral supports into the area where the operator is presently installing components. Thus, the operator can select an area to be populated, and proceed very quickly by moving the components from the bins or the like into their installed positions, with short, quick and accurate movements. The fine and coarse positioning guides are coupled such that their spans of displacement add together for positioning the mounting head(s), but the guides operate independently.

The hand rest can be provided at the distal end of an arm to which the mounting head assembly is connected. The arm include or be mounted to linearly movable means, polar couplings, etc., in any case placing the mounting head in a plane over the circuit board. The hand rest preferably is located below and within finger reach of the handle, turret and/or similar parts which are displaced or rotated by the user to pick and place components.

According to one aspect of the invention, the hand rest is demountably connected to the arm by a first fastening means. The first fastening means allows the hand rest to be positioned on one side of the mounting head assembly or on the opposite side. Similarly, the handle is demountably connected to the mounting head assembly by a second fastening means that allows the handle to be positioned on one or the other sides of the mounting head assembly. Thus, the invention is easily adapted to use by right handed and left handed operators.

The handle is coupled to the mounting head to move the mounting head vertically for picking up and releasing components. The handle also rotates about a vertical axis. Rotation of the handle about the vertical axis rotates the mounting head about its vertical axis for proper positioning of components held by the mounting head.

According to another aspect of the invention, a single mounting head or a plurality of mounting heads can be interchangeably mounted upon the arm. By providing independently controlled holding means for each pickup or mounting head, which holding means remains on or off when a different pickup or mounting head is selected by the operator, the device can be loaded with a number of components, and then operated to place them, without the requirement of making large displacements between the storage bins and the placement locations for each component in turn.

The invention provides an inexpensive positioning mechanism that is appropriate for small and customized production runs. Although the apparatus is manually operated, it is capable of accurate component placement in the horizontal (X-Y) field, over a vertical span as needed to pick up and set down the component, and with controlled rotation to correctly align the component to its intended circuit board location. Moreover, the device is operable manually at high speed, allowing an operator to mount a large number of components in a minimum of time.

These and other aspects of the invention will be appreciated with reference to the following discussion concerning certain preferred arrangements disclosed as nonlimiting examples.

BRIEF DESCRIPTION OF THE DRAWINGS

The drawings show embodiments of the invention as presently preferred. The invention is not limited to the embodiments shown as preferred examples, and is capable of variation within the scope of the appended claims. In the drawings.

DETAILED DESCRIPTION OF THE PREFERRED EMBODIMENTS

An embodiment of the invention having a plurality of pickup or mounting heads 20 is shown in FIGS. 1-10, and an alternative embodiment having only one pickup/mounting head 20 is shown in FIGS. 11-15. In each case, the positioning apparatus is arranged to be translated in a plane parallel to a circuit card 22, and has vertical displacement capability for the pickup head(s) 20 associated with a holding means. The holding means is operable independently for each of the pickup heads to attach the components temporarily to the respective pickup head 20 and to hold the component pending placement. In the preferred embodiments shown, a vacuum switching arrangement is provided for engaging components selectively on the pickup head 20 and releasing them. Other holding means are possible, such as mechanical clamping, magnetic, adhesive or other holding techniques that allow the components to be picked up and held while they are moved to their destination using superimposed coarse and fine positioning guides. The components are picked from their storage locations and placed at the proper position on the circuit board and at the correct orientation, where they are held for soldering, e.g., by adhesive or the like. The pick and place movements are controlled manually.

Figure 1:
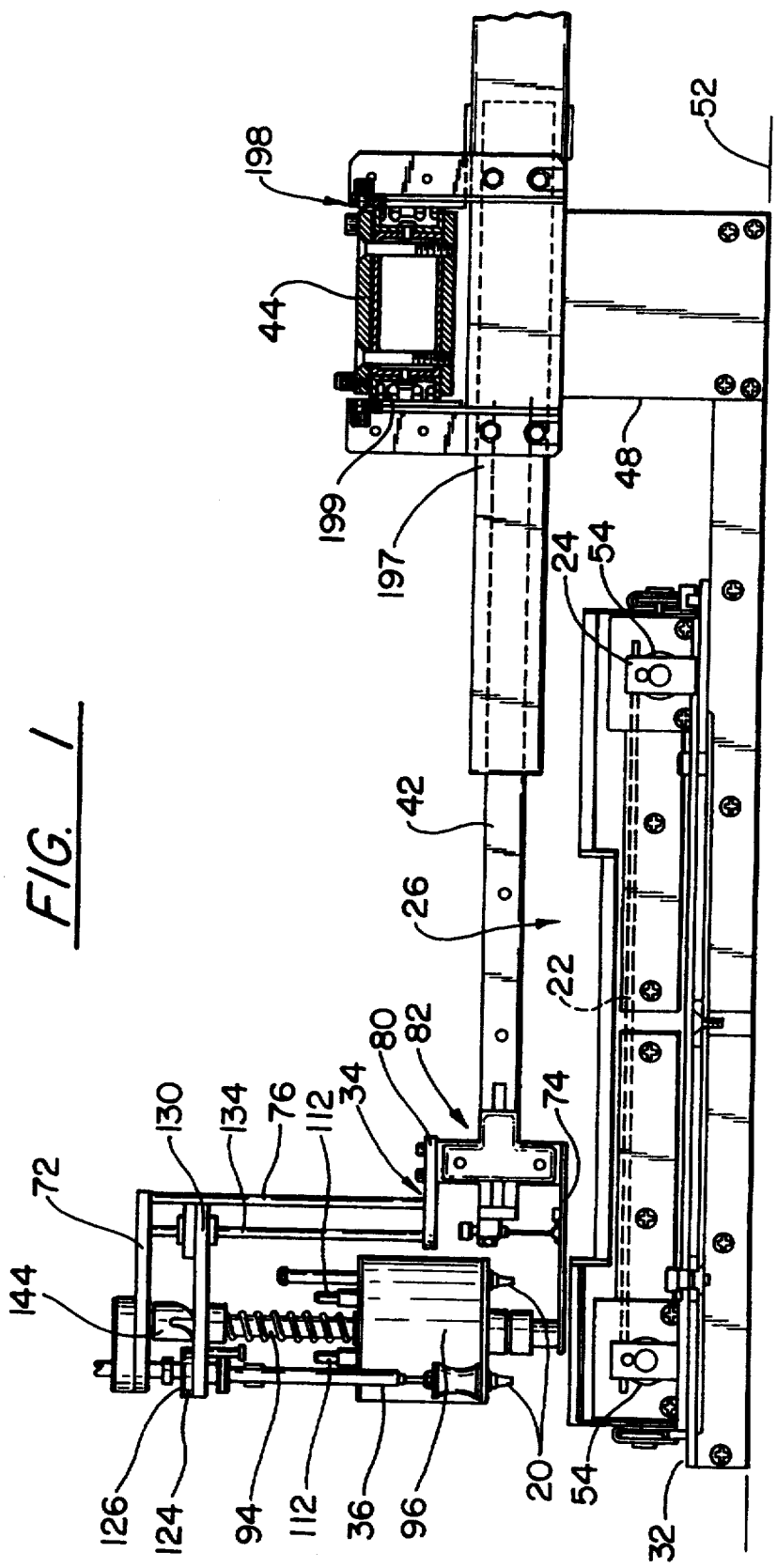
FIG. 1 is a side elevation view, partly in section, showing the major translational guide mechanisms of a multi-head apparatus according to the invention.
Figure 2:
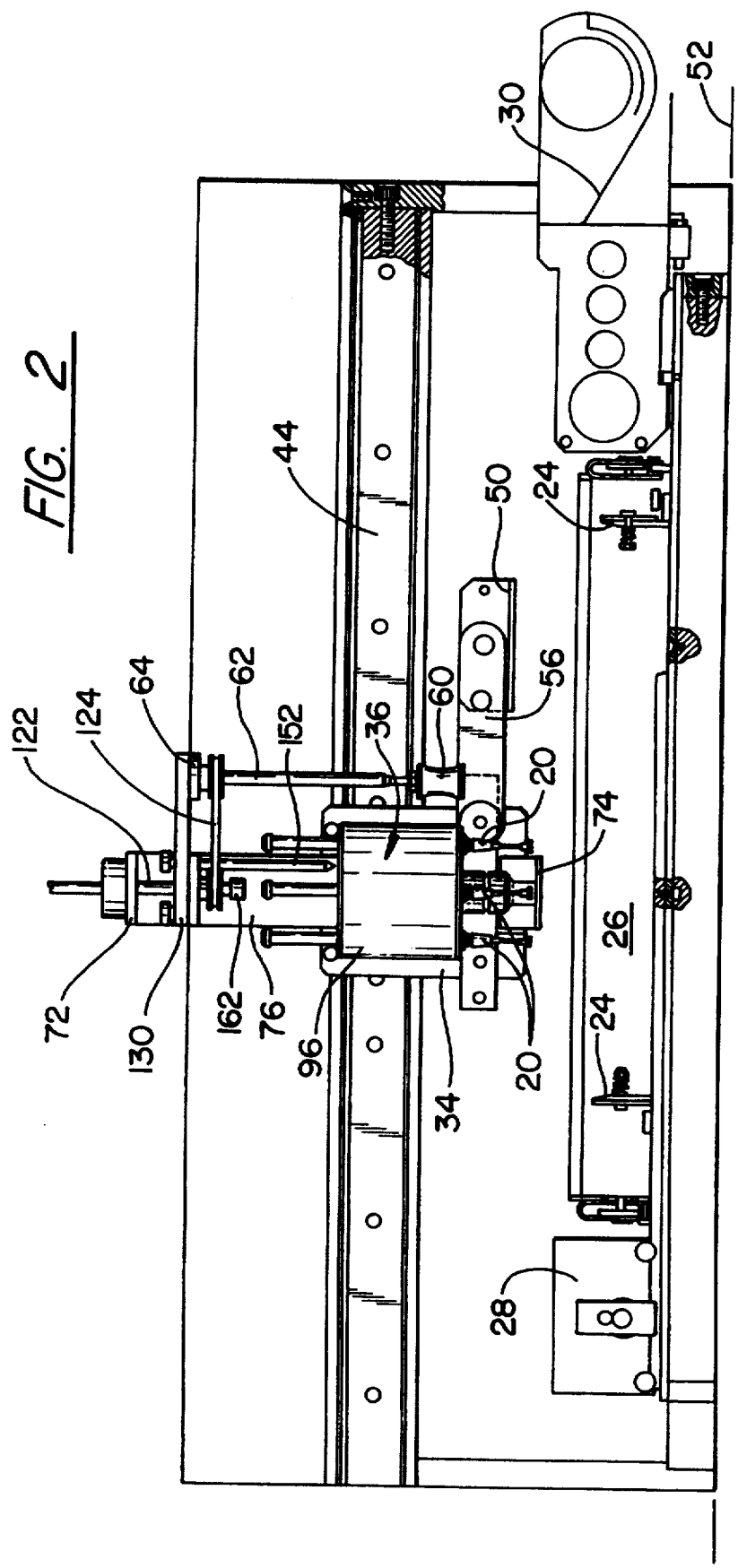
FIG. 2 is a front elevation view according to FIG. 1.
Figure 3:
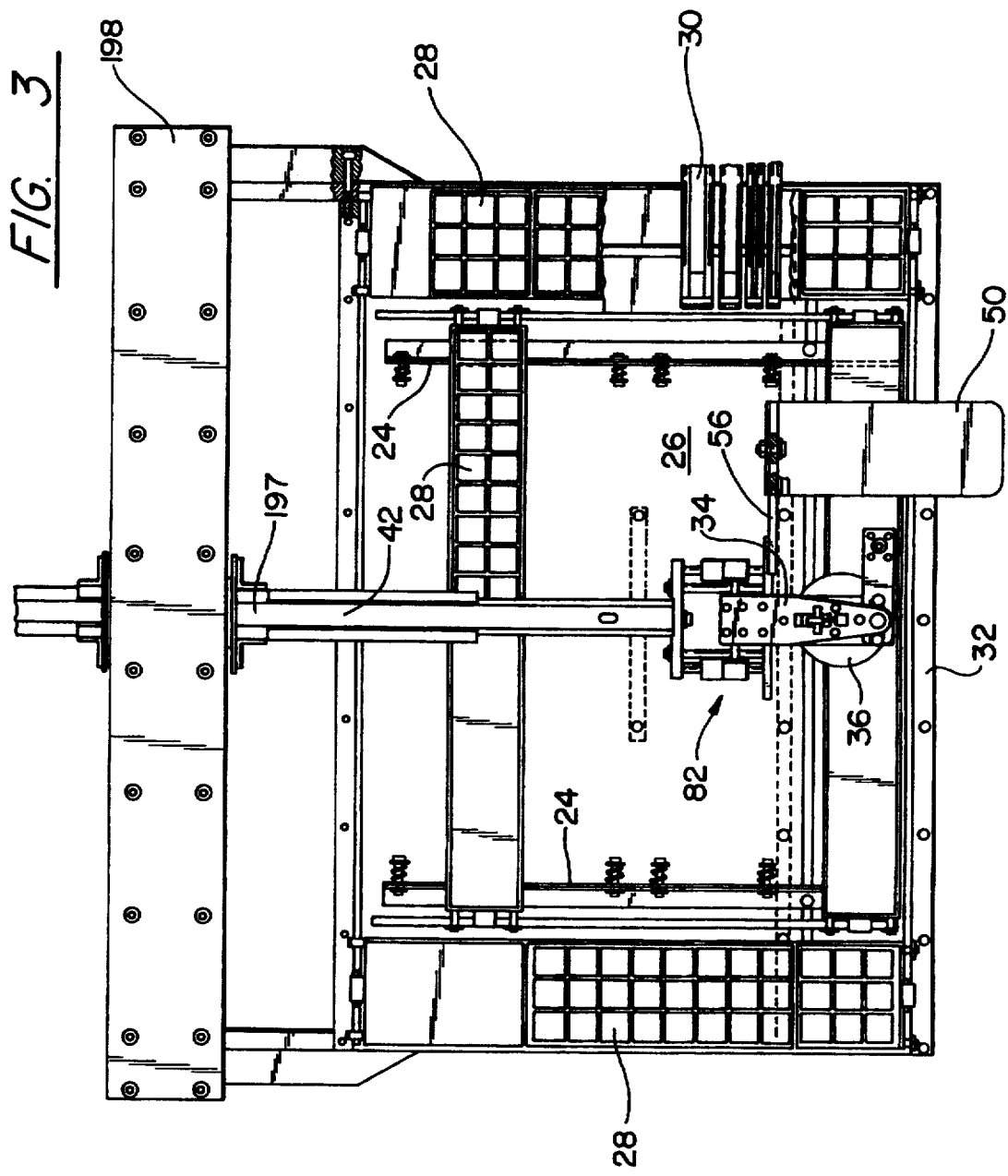
FIG. 3 is a top plan view thereof.

As shown in FIGS. 1-3, a table mounted apparatus is provided for picking up surface mountable devices (SMDs) and similar components from one or more supplies, moving the components into position over a circuit board 22, and setting the components on the circuit board 22 at the correct X-Y position on the circuit board, and at the correct rotational position of the component relative to the circuit board to align the leads of the component to conductors on the circuit board. The circuit board 22 can be fixed between two spring clamps 24 disposed along the sides of a work area 26 spanned by the displacement of the pickup heads 20, the circuit board 22 thus being disposed horizontally. As the head of the mounting assembly is moved about, the bins carrying the components can be shifted in position, for example being supported by rollers on rails extending along the margins of the work area, such that the bins are adjacent the area of the circuit board presently being populated.

The apparatus comprises a series of guiding structures and manually graspable and movable elements for positioning the at least one pickup head 20 alternately at a supply 28, 30 of components and at chosen locations on the circuit board 22, and is operable using one hand. Movable holders having divisions separated into receptacles can be located around the periphery of the work area and moved on rollers into proximity with the pick-and-place apparatus for conveniently extracting the components from the receptacles and setting them on the circuit board. The bins have rollers carried on rails around the work area such that the bins can roll right up to the area to be populated, with the operator then needing only short, quick movements to pick and place components, especially a succession of the same type of component. For maximum efficiency, the peripheral bins can be used for the most frequently needed components, and less frequently needed components can be spaced farther from the edge.

In FIG. 3, the user sits or stands at the front area 32 corresponding to the bottom of the drawing. The user area is to the left in FIG. 1. Major displacements are effected by the user translating the coupling for the carriage structure 34 supporting the turret 36 or multi-head pickup element. A forward/rearward substantially telescoping guide arm and bearing arrangement 42 permits the carriage 34 to be pulled forward to or past the front edge of the circuit board 22 or the like positioned in work area 26. The lateral, front and/or rear margins can be used to hold a supply of components to be mounted on the circuit board 22. Left and right translations are guided by a sliding rail or bridge structure 44 at the rear 48 of the work area 26 as shown, which serves to carry the forward/rearward telescoping guide structure 42 laterally back and forth. It would also be possible to rearrange the telescoping guide 42 and sliding rail/bridge structure 44 such that the telescoping provides lateral displacement and the sliding provides forward/rearward displacement, to provide a polar positioning structure having rotatable and extensible elements, etc. In any event, gross positioning of the pickup head is provided by mechanical means supporting the pickup head assembly in plane, with the supporting structure being positionable by the user in the general area to be populated.

The major displacements provided by the telescoping and lateral guides 42, 44 are free and relatively low friction due to the provision of appropriate bearings and the like, permitting the user to move the carriage and pickup mechanisms therein relatively easily. However, the user must overcome the inertia of the movable parts of the major or gross positioning apparatus, which is less suitable for very fine positioning movements, e.g., as needed to align surface mount components precisely to their circuit board lands. Accordingly, fine additional positioning guide structures are provided, aligned parallel to the plane of the circuit board, whereby the user can effect fine adjustments in position while moving only a small portion of the overall support structure.

The user positions the pickup head or heads 20 manually. The user rests his or her hand on a hand rest 50 coupled to the gross positioning means coupled to the carriage 34 carrying the turret 36 or other mounting head structure. While positioning the head in the vicinity of the desired location of the particular components, the user has the capability of fine positioning movements wherein the pickup heads are moved about in the span of a fine positioning guide coupled to the gross positioning guide and movable independently of the gross positioning guide within a limited span of movement. In the general area of the placement position the user has control of the orientation of an operative one of the pickup heads 20, and control of the vertical position of the pickup heads 20. These controls are enabled by finger operation of movable elements of the carriage and turret structure while the user's hand rests on the hand rest 50, the latter enabling gross positioning in the X-Y horizontal plane and the user effecting fine positioning by hand/finger adjustment of the positioning heads relative to the junction with the telescoping arm 42 or the like.

In FIG. 2, the circuit board 22 is shown held at fixed position and elevation slightly above the table top 52 on which the apparatus rests. The circuit board 22 can be held securely in place by the clamp structure 24, and adjustable supports 54 disposed under the circuit board 22 allow the vertical position of the board 22 to be set precisely. In the area around the board, a band-feed supply 30 of components attached to a rolled sheet of paper or the like can be provided by a feeder as shown schematically in FIG. 2. Alternatively or in addition, the area around the board can be provided with a number of bins 28 as shown in FIG. 3, carrying a supply of components that the user selects when populating the circuit board 22. Preferably, these holders of the supply of components can be shifted in position by the user such that the supply is brought out over the circuit board, to a position adjacent the position of the pickup/placement head. Accordingly, only a short shift of the placement head is needed to move from the supply of components to their destination. The circuit board 22 is held in registry with the adjustable supports 54 and with the spring clamps 24, whereby successive circuit boards are repeatably held in the same position. The supply bins or feeder is carried by rollers on rails at the margins of the work area.

The hand rest and finger controls are demountable from the carriage portion 34, e.g., holding a turret 34 with a number of vertically movable pickup heads 20, and can be fixed to the carriage portion on the left or right. Thus the device can be readily arranged for operation by a left handed or right handed operator. As shown in FIG. 2, the hand rest 50 is mounted to the carriage 34 on a lateral support bracket 56 that attaches to the carriage 34 on either side by bolts. Similarly, the finger operated controls such as the picker rotation spindle 60 and the shaft 62 and journal 64 therefor, can be readily detached and placed on the other lateral side of the carriage 34. In the left or right position, the user can move the gross positioning apparatus via the hand rest coupling to the support structures, and can move the fine positioning apparatus with respect to the hand rest by making hand and finger movements that shift the pickup/placement head relative to its attachment to the grossly positioned structures.

Figure 4:
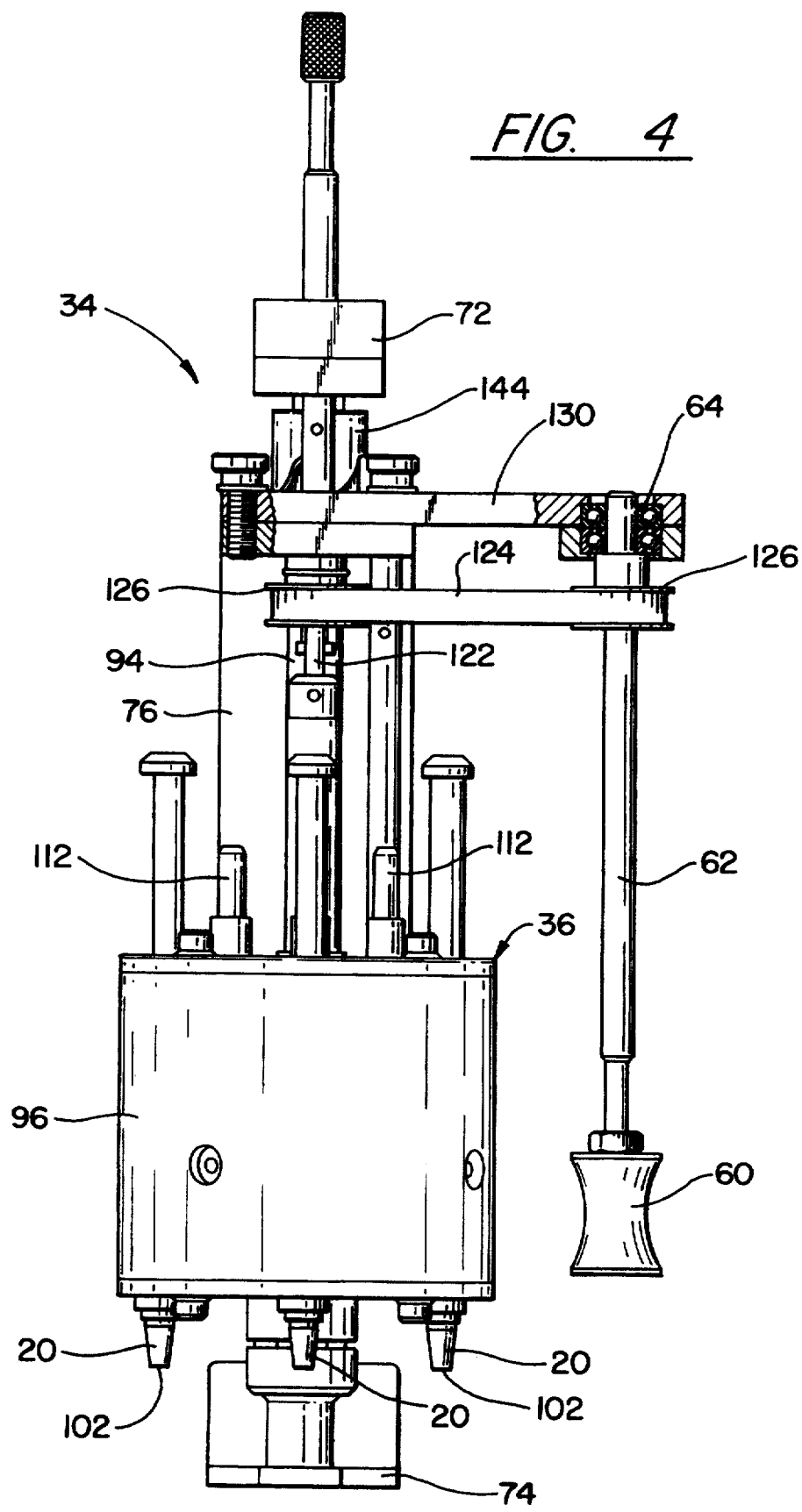
FIG. 4 is a partial front elevation view showing the rotational guide mechanisms associated with the turret.
Figure 5:
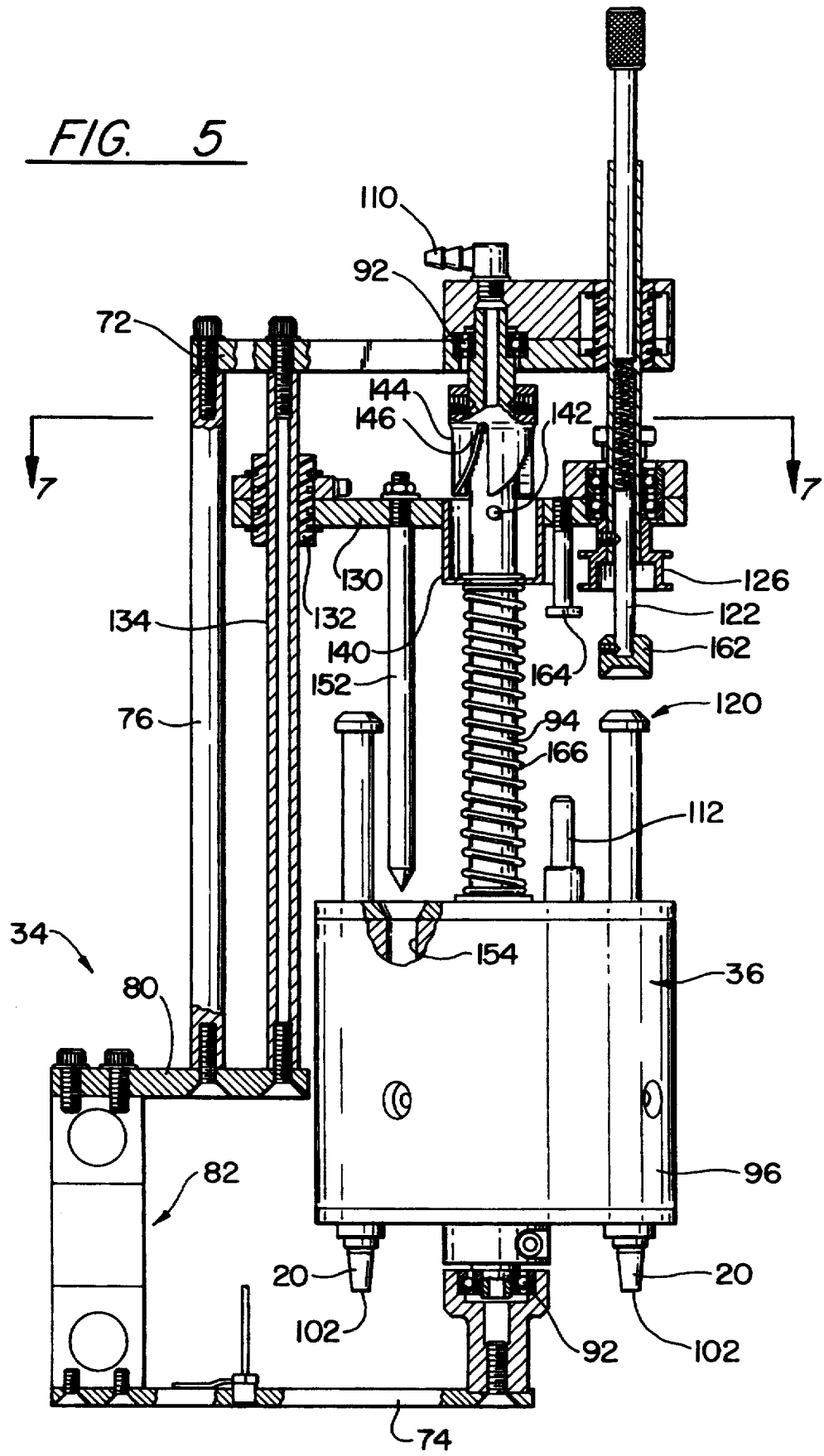
FIG. 5 is a partial vertical section view, showing the vertical displacement guide mechanisms of the pickup heads and the turret.
Figure 6:
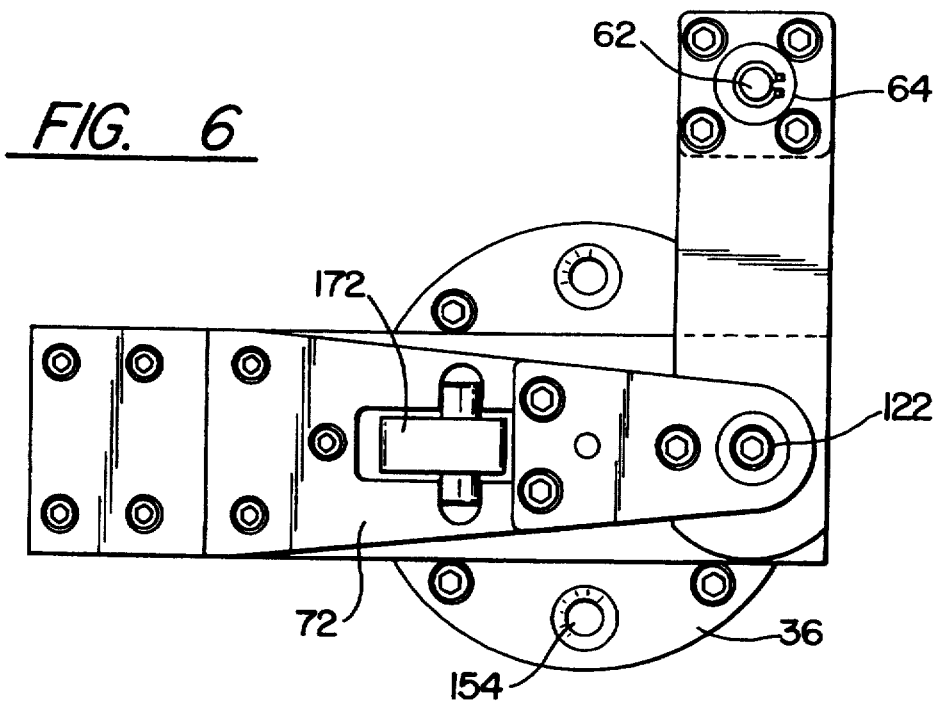
FIG. 6 is a top plan view showing the carriage and turret structure.
Figure 7:
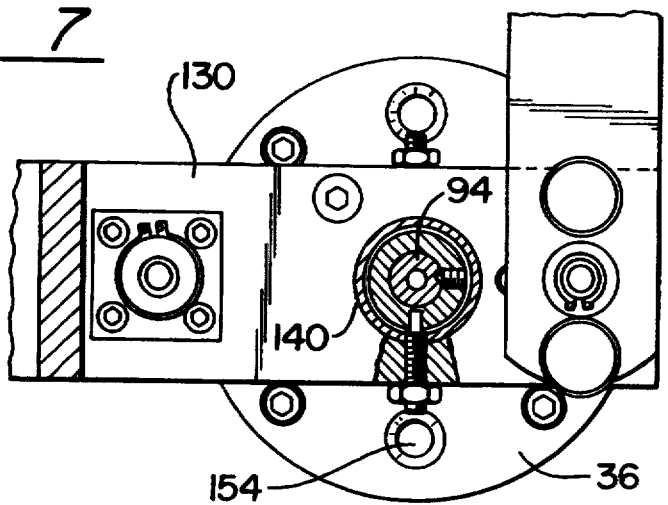
FIG. 7 is a section view along lines 7—7 in FIG. 5.
Figure 8:
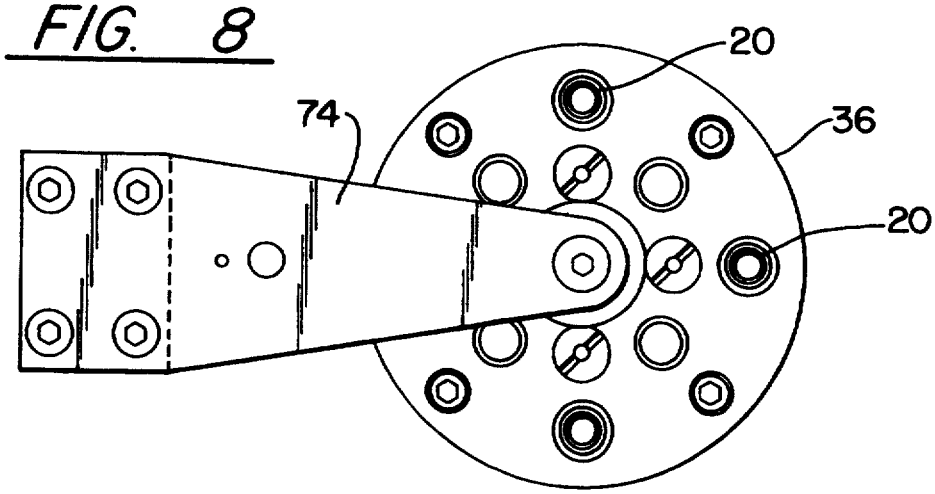
FIG. 8 is a bottom plan view of the carriage and turret structure.

FIGS. 4-8 illustrate the carriage 34 carrying the turret 36, and the plurality of pickup heads 20 therein, four being shown for purposes of illustration. FIGS. 4 and 5 show the carriage and turret mechanisms partly in section. FIGS. 6 and 8 are top and bottom plan views of the carriage and turret assembly, and FIG. 7 is an intermediate section view as indicated in FIG. 5. The carriage 34 generally comprises a fixed upper plate 72 and lower plate 74, rigidly attached via at least one vertically extending structural support bar 76. In the embodiment shown, the support bar 76 extends between the upper fixed plate 72 and an intermediate plate 80, the intermediate plate 80 being fixed to a part of the translation mechanism that is in turn rigidly fixed to the lower plate 74. The upper and lower support plate 72, 74 are provided with bearings or similar journal fittings 92 for rotatably carrying the turret shaft 94 and the turret body 96 thereon. The turret body 96 carries a plurality of axially displaceable pickup heads 20, and has internal passageways and valves that couple a vacuum source to the pickup heads 20, which are hollow for holding components on the bottom ends 102 of the pickup heads via suction. The vacuum source is coupled to the turret body 96 by the turret shaft 94, which has a vacuum fitting 110 at the top and is hollow for coupling the vacuum to the turret body 96. It would also be possible to employ other forms of holders, such as mechanical clamps, magnetic holders, adhesive holding (with a means for pushing the components free), or the like. A suction arrangement is preferred, wherein the components are held via controls operable independently for each of the heads, selectively to pickup and hold individual components.

The vacuum to the respective pickup heads 20 is controlled separately by switches 112 associated with each of the pickup heads 20. The user can pick up a number of components on the respective pickup heads 20 of the turret 36, hold the components on the turret 36 by leaving the vacuum on, and move to the respective locations of the components on the circuit board 22, one at a time. The pickup heads 20 can be arranged to carry components of different types, via differently sized or shaped bottom faces 102 of the respective pickup heads 20. Alternatively, the pickup heads 20 can be structured the same.

The turret 34 is arranged to seek alignment between any one of the pickup heads 20 and an operative picker location 120 in which one of the pickup heads 20 (the operative one) is aligned co-linearly with a picker rotation shaft 122. The picker rotation shaft 122 is mechanically coupled for rotation by the finger operated picker rotation spindle 60 adjacent the hand rest 50, coupled to the picker rotation shaft 122 by an endless belt 124 passing around pulleys 126 on the picker rotation shaft 122 and the spindle shaft 62. The spindle shaft 62 is journalled at its upper end in a vertically movable control plate 130, enabling the user to move the control plate 130 upwardly or downwardly relative to the turret body 96. The control plate 130 is slidable via bushings 132 on slide shafts 134 coupled to the fixed upper plate 72 of the carriage 34, and either to the fixed bottom plate 74 or the intermediate plate 80 to which the support bar 76 is attached.

When a pickup head 20 is disposed at the operative picker location 120 under picker rotation shaft 122, the pickup head 20 can be controlled for vacuum on/off, vertical position in the turret 36 and rotational position around its axis. These controls are effected by the user via manual manipulation of the picker rotation spindle 60 and the hand rest 50. Simultaneously, the X-Y position of the turret 36 (and the selected operative pickup head 20) can be controlled via the coarse and fine positioning of the translation mechanism, by manual manipulation of the carriage 34 via pressure exerted on the spindle 60 and hand rest 50. Therefore, the user has full control of the device via one hand, placed on the hand rest 50, in range of finger control of the spindle 60 and turret 36. Although the user can use two hands, the respective movable parts are arranged such that only one hand is absolutely needed.

A cup shaped bushing 140 having a radially oriented pin 142 is fixed to the control plate 130, and the bushing 140 fits around a rosebud cam 144 fixed to the turret shaft 152. The rosebud cam 144 has receptacles 146 for the pin 142 that cause the turret shaft 152 to align one of the pickup heads 20 to the picker rotation shaft 122 when the control plate 130 is raised to an upper position where the bushing pin 142 rests in one of the narrow apices of the rosebud cam receptacles 146. When the control plate 130 is lowered such that the pin 142 of the cup shaped bushing 140 is clear of the rosebud cam 144, the turret shaft 94 is free to rotate, whereby the user can select a different pickup head 20 to be lowered by rotating the turret 36. The turret 36 is located adjacent the picker rotation spindle 60, and is readily rotated via the user's fingers when the control plate 130 is in its intermediate position.

Normally, the user advances from one of the pickup heads to the next in a regular manner. The rosebud cam is arranged to advance the position of the turret from one pickup head to the next. If the control plate 130 is lowered to disengage the rosebud cam (by downward pressure on the picker control spindle 60), a locking shaft 152 fixed to the control plate 130 engages in an alignment opening 154 in the turret 36. The locking shaft 152 and alignment opening 154 are tapered, and initially are misaligned slightly with the angular position of the pickup heads 20 in the turret 36. The engagement of the shaft 152 and turret 36 moves the turret slightly forward, to a position where the pin 142 is advanced to align with a next receptacle of the rosebud cam. Therefore, the next time the control plate is raised, pin 142 is engaged in the next receptacle of the rosebud cam, and moves the turret to place the next mounting head in the turret in the operative position. The shaft 152 and opening 154 are tapered at their ends to achieve this rotational advance of the turret as shaft 152 and opening 154 come together axially. Accordingly, raising and lowering the control plate causes the turret to move from one picker to the next. If the user so requires, the turret can be positioned manually, i.e., rotated while in an intermediate position. In the intermediate position the turret can be rotated manually, the pin 142 being lower than the receptacles of the rosebud cam in the intermediate position and the shaft 152 being clear of the opening 154.

The lower end of the picker rotation shaft 122, which has an enlarged cap 162, comes into contact with the top end of the pickup head 20 in the operative position 120, and forces the pickup head 20 downwardly toward the circuit board 22 or toward a pickup location. The operative pickup head 20 can then be rotated around its axis via the picker rotation shaft 122 as controlled by the picker rotation spindle 60. Thus the control plate and the handle associated therewith permit the user to place individual components held in on the turret.

A vacuum control switch 112 for each of the pickup heads 20 is provided on the upper face of the turret 36, in position to be pressed downwardly by a switch operating shaft 164 protruding downwardly from the control plate 130. The vacuum control switches 112 are press-on, press-off alternatively activated mechanisms that couple or decouple vacuum from the conduit in the turret shaft 94 to the pickup head 20 every other time the switch 112 is pressed. The control plate 130 is biased by a helical compression spring 166 between the turret body 96 and the control plate 130 to the intermediate position at which the locking shaft 152 is clear of the alignment opening 154 and the radial pin 142 of the cup shaped bushing 140 is clear of the rosebud cam 144. Preferably, a clockspring 172 is coupled between the fixed upper plate 72 and the control plate 130 to provide a constant force counterweight for the control plate 130 and its attached components, in a manner similar to a window sash balance.

In operation, the user pulls or pushes the carriage 34 to a desired X-Y position for picking up a component, using the coarse and fine positioning capabilities discussed in more detail hereinafter. A desired (unused) pickup head 20 is brought roughly into alignment with the operative picker location 120, then more nearly into alignment by raising the control plate 130 to engage the radial pin 142 in the rosebud cam 144. The control plate 130 is then lowered, locking the alignment of the turret 36 via locking shaft 152, and forcing the operative pickup head 20 downwardly via picker rotation shaft 122 and the contact end 162 thereof. The vacuum to the operative pickup head 20 is switched on by contact of bolt 164 and alternating switch 112. The component is then engaged by vacuum on the bottom 102 of the operative pickup head 20. The user can then either move to the destination of the component or continue in the same manner to pick up additional components until all the pickup heads 20 are carrying a component.

For placing the components the same actions are undertaken, except that additionally the user rotationally positions the component around the axis of the picker rotation shaft 122, via manual rotation of the picker rotation spindle 60, before releasing the vacuum by lowering the control plate 130 until the bolt 164 contacts the alternating switch 112 to shut off vacuum to the operative pickup head 20.

To accommodate both gross and fine positioning, the sliding rail 44 and telescoping arm 42 of the coarse guide structure of FIGS. 1-3 are used generally to position the carriage 34 holding the turret 36 and pickup heads 20. Between the coarse guide (rail 44 and arm 42) and the carriage 34, a manually operated second guiding mechanism 180 is disposed, for effecting fine positioning of the carriage 34 over a minimal adjustment span, without the need to displace the heavier telescoping and sliding rail structures 42, 44. The fine positioning structures 180 are substantially independent of the gross translational guides. Manual force exerted by the user can displace the fine positioning guide to the end of its span, whereupon the gross positioning guides 42, 44 begin to move.

The gross positioning guides have a span that encompasses the work area, including the area of the circuit board and any storage bins located around the circuit board. The fine positioning guides preferably have a span of about one inch, i.e., being movable ±0.5 inch from center. This span is sufficient to enable the user to make quick short picking and placing finger movements. The storage bins are preferably mounted movably on rollers that ride on rails on opposite sides of the work area, such that the storage bins can be moved up into proximity with the location on the circuit board being populated by the operator. The storage bins are supported just above the circuit board, and can be rolled laterally or forward/rearward up to the selected area of the circuit board. At least for components located at the outermost bins, only a short movement is required for the operator to pick a component from the bin and place it on the board. The most frequently selected components can be stored at the peripheral edges of the storage bins, which are like rolling subdivided shelves.

Figure 9:
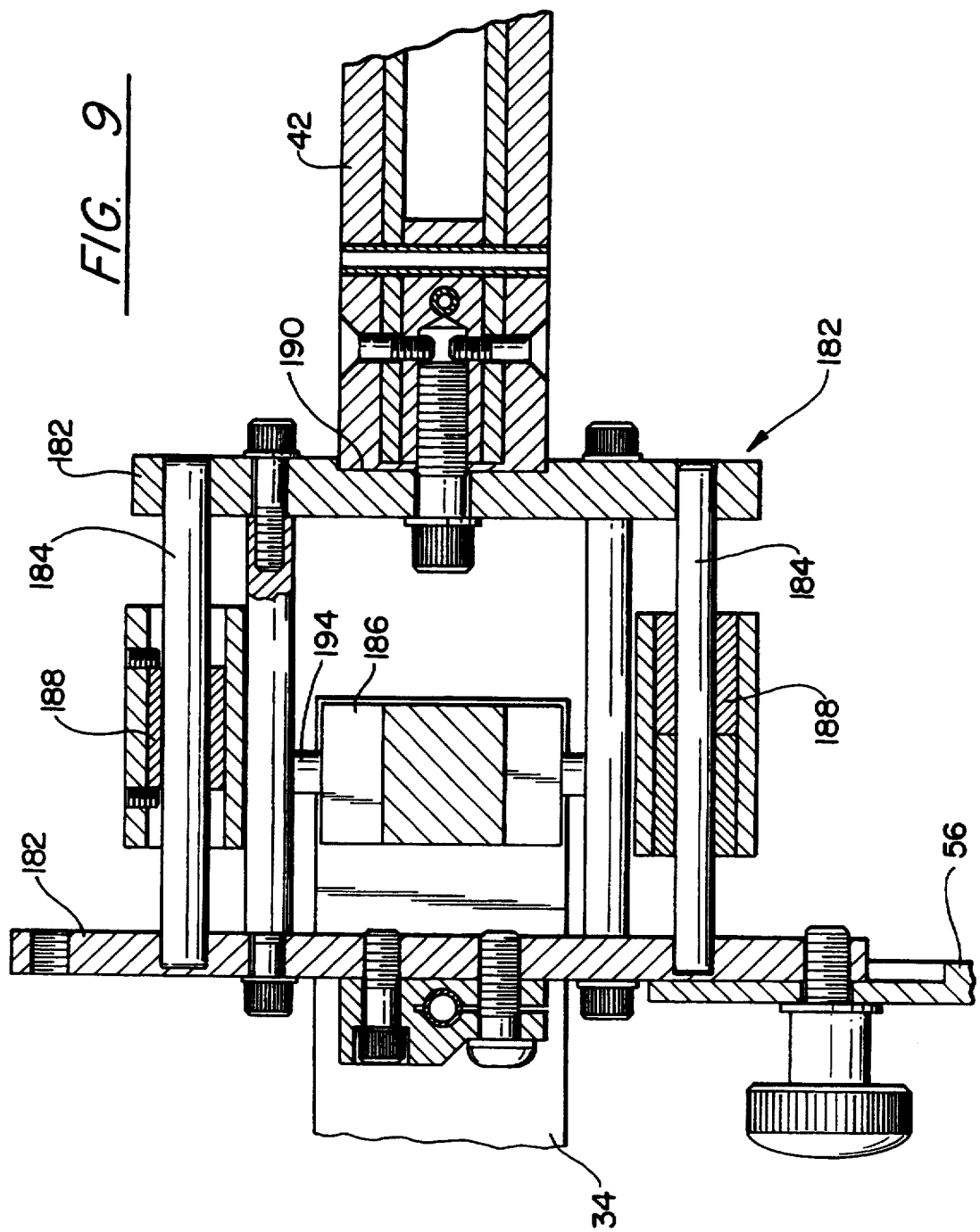
FIGS. 9 and 10 are section views at perpendicular angles through the coupling of the carriage assembly and the coarse/fine X-Y positioning mechanisms.
Figure 10:
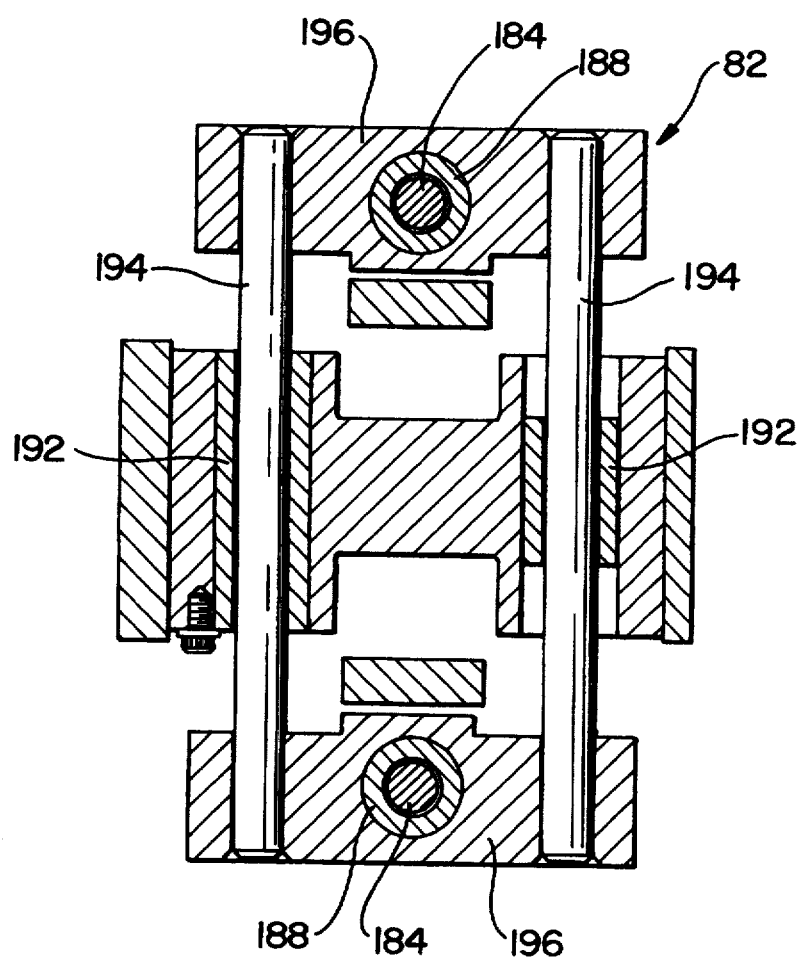
Figure 11:
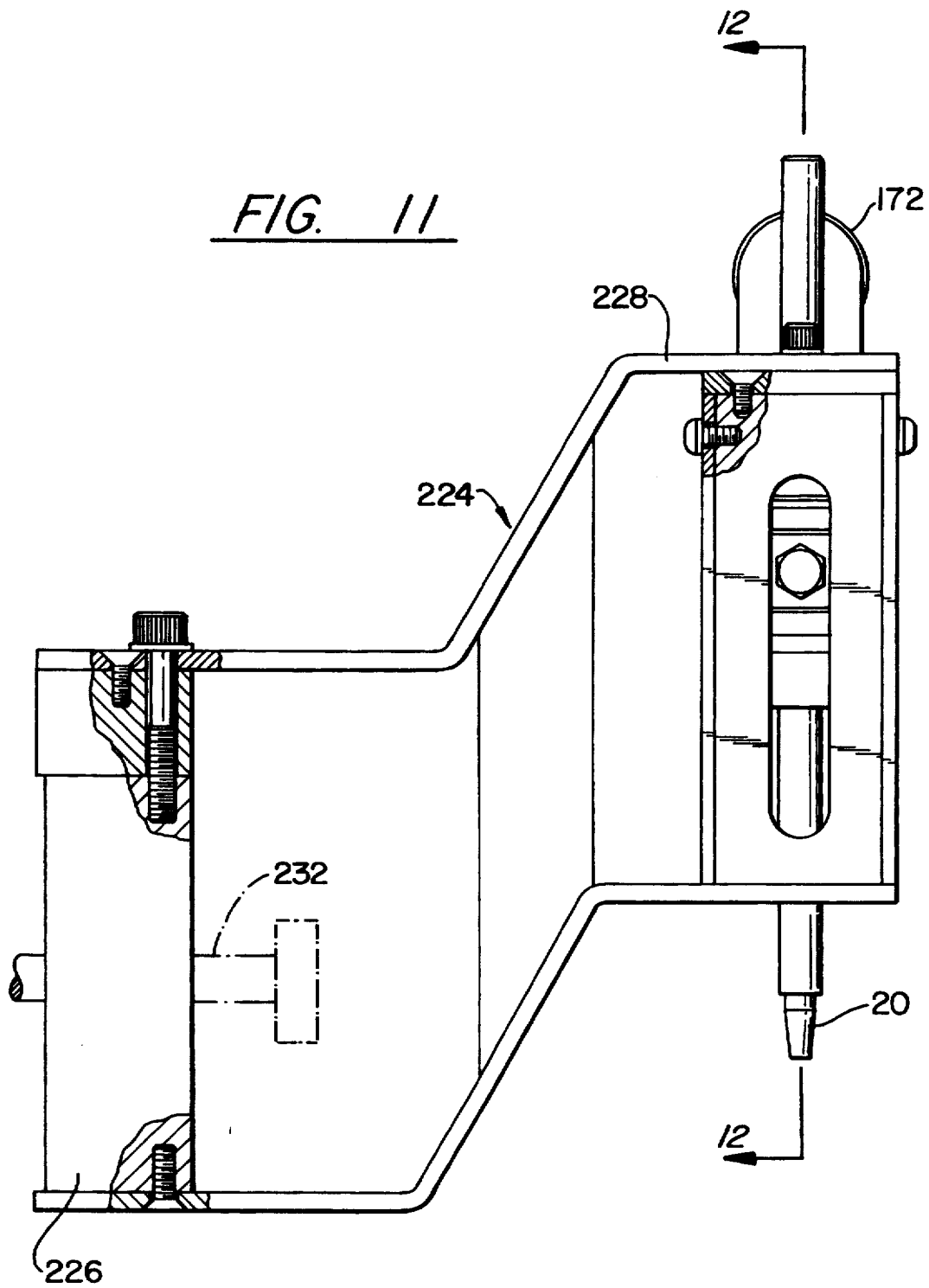
FIG. 11 is a side view, partially in section, illustrating an alternative embodiment having one pickup head.

The fine positioning guide structures 180 are mounted at the front of the telescoping guide 42 as shown in FIGS. 1 and 3, and accommodate a limited span of displacement in the same plane as the gross positioning guides 42, 44. The specific fine positioning structures are shown in FIGS. 9 and 10. For linear movement in the direction of displacement of the telescoping arm 42, the carriage 34 is carried on the end of the telescoping arm via a support structure comprising two vertical plates 182, attached together rigidly at a space defining the span of fine adjustment. Two horizontally spaced guide shafts 184 extend between the vertical plates 182 and carry an intermediate sliding body 186 that is fixed to the carriage 34 and is similarly arranged for lateral sliding movement. As shown in FIG. 9, the displacement of the bushings 188 between the vertical plates 182 permits forward/rearward displacement of the carriage 34 relative to the end 190 of the telescoping arm. As shown in FIG. 10, displacement of the carriage bushings 192 on laterally extending guide shafts 194 similarly permits lateral displacement of the carriage 34 relative to the telescoping arm 42 up to the span between the lateral confining plates 196.

Whereas the mass of the carriage 34 is only a portion of the mass of the movable elements of the entire X-Y positioning apparatus, the fine positioning guides are displaced to the ends of their span when the carriage is moved by the user exerting a force on the carriage 34 or on the spindle 60, causing the bushings 188 or 192 to abut against the respective confining plates 182 or 196. When thus abutted, further force on the carriage 34 causes the telescoping arm 42 to extend or retract, or causes lateral displacement of the proximal end 197 of the telescoping arm 42 relative to the lateral rail 198 of bridge structure 44. Suitable bearings and wheels 199 preferably guide the telescoping arm 42 smoothly in lateral displacement and in extension/retraction. In use, the user's arm and hand movements bring the device into the general area where components are to be picked and/or placed, due to force on the distal end of the arm 42, which is attached to the hand rest 50. Shorter movements within the span of the fine positioning guides are then effected by hand and finger movements, to position the device precisely, without the need to move the movable parts of the gross positioning means and with the greater accuracy that is available using finger movements. As shown in FIG. 9, the hand rest bracket 56 is coupled to the arm 42 rigidly, via the end plates 182 and guide shafts 184. The carriage 34, however, is movably mounted relative to arm 42 by the additional span of the fine positioning guides. The manual dexterity of the operator's fingers is thus put to full advantage because the spindle 60 and turret 36 remain at all times within finger range. Moreover, the strength of the operator's arm is available for making coarse (longer span) movements when needed. As also shown in FIG. 9, the bracket 56 can be readily demounted via a thumbscrew, and mounted at a corresponding position on the opposite lateral side of the plate 182, for left handed operators.

The embodiment of FIGS. 1–10 has the advantage that the operator can load a plurality of the pickup heads with components, and then move to place them. The number of transits to the storage bins is thus reduced. Whereas the fine positioning feature and the movable storage bins further contribute to the speed of pickup and placement, the operator can populate a board very rapidly and accurately, even though the apparatus is manually rather than robotically controlled.

FIGS. 11–15 illustrate an alternative embodiment wherein only one pickup head 20 is provided on the carriage 34. The same reference numerals are used in FIGS. 11–15 to identify elements that correspond to the elements of the embodiment of FIGS. 1–10. The carriage 34 comprises a bracket support 224 that extends upwardly from a base block 226 such that the forward end 228 (the user end) of the bracket support 224 is spaced above the level of the circuit board (not shown in FIG. 11), and carries the pickup head 20. The base block 226 can be coupled to a gross positioning means as in FIGS. 1–3, and a fine positioning means as in FIGS. 9–10. However, in FIG. 11 the positioning freedom of the carriage is indicated generally by slide shaft 232, shown in phantom lines. As in the previous embodiment, the user controls the X-Y position of the carriage 34 by manual force, and controls the pickup head 20 by hand operation, including raising, lowering and rotating a control spindle 60 to effect corresponding movements of the pickup head 20.

Figure 12:
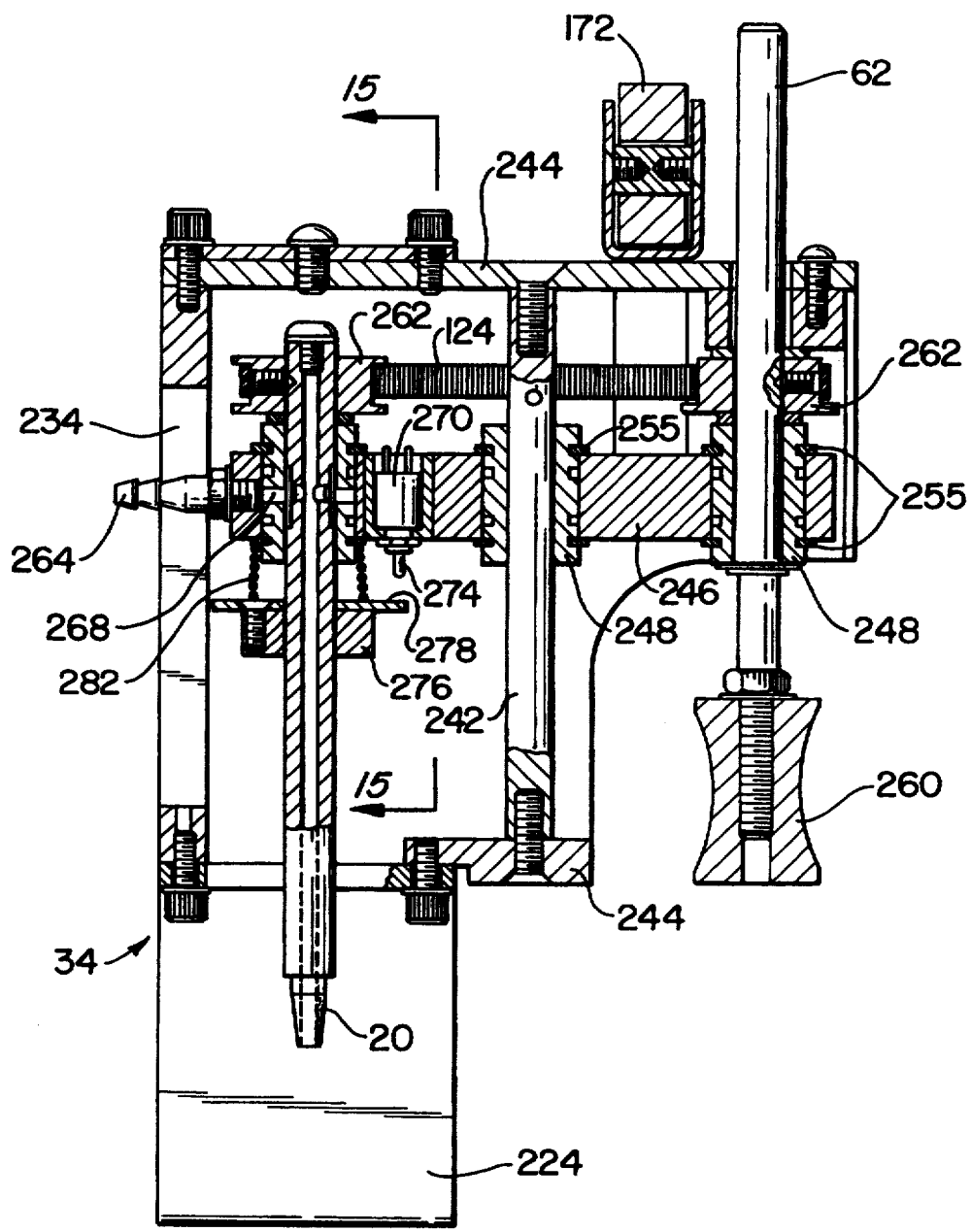
FIG. 12 is a front section view along lines 12—12 in FIG. 11.

The control spindle arrangement is shown sectionally in FIG. 12. A support bar 234 and sliding shaft 242 are fixed between upper and lower plates 244. A control plate 246 has bushings 248 carried on the sliding shaft 242, allowing the control plate 246 to move up or down. The spindle shaft 62 and the pickup head 20 are each axially fixed in the control plate 246 via bushings 248 captured by C-clasps 255, each being rotatable in the control plate 246. The spindle shaft 62 terminates at its end in a spindle 260 configured for manual manipulation by the user, i.e., for vertical displacement relative to the carriage 34 (carrying along the control plate 246) and for rotation. Pulleys 262 on the upper ends of the spindle shaft 62 and the pickup head 20 are coupled by an endless belt 124, such that rotation of the spindle 60 causes rotation of the pickup head 20 on its longitudinal axis. As in the previous embodiment, the user positions the carriage 34 at a desired X-Y position, and pulls the pickup head 20 downwardly to engage or release a component.

In FIG. 12, a vacuum fitting 264 is coupled to a bore in the control plate 246 communicating with a longitudinal bore 268 in the pickup head 20. An alternating-operation switch 270 is mounted in the control plate 246 and has a pushbutton element 274 protruding downwardly from the control plate 246. The switch 270 is also shown in a cross-sectional view in FIG. 15. The switch 270 enables or disables vacuum to the pickup head 20. For example, the switch 270 can be a push-on/push-off electrical switch coupled for controlling a solenoid valve (not shown) along the vacuum line, or a mechanically alternating valve along the line.

A contact member 276 is axially movable on the pickup head 20 and has a circular flange 278 that extends radially from the pickup head 20 into the range of the switch 270. The contact member 276 is suspended below the control plate 246 by a compression spring 282. When the control plate 246 is lowered by a manual operation of the user, the contact member 276 is carried along. At or near the full downward displacement of the contact member 276 and the pickup head 20, the contact member 276 comes into contact with the lower plate 244 of the carriage 34 and is displaced upwardly relative to the pickup head 20 to operate the vacuum controlling switch 270. Thus, the user brings the pickup head 20 down to pick a component, the vacuum being switched on, moves to the destination and again brings the pickup head 20 down (accompanied by rotation of the head 20 via spindle 60 if needed), whereupon the vacuum is turned off and the component is released in place.

Figure 13:
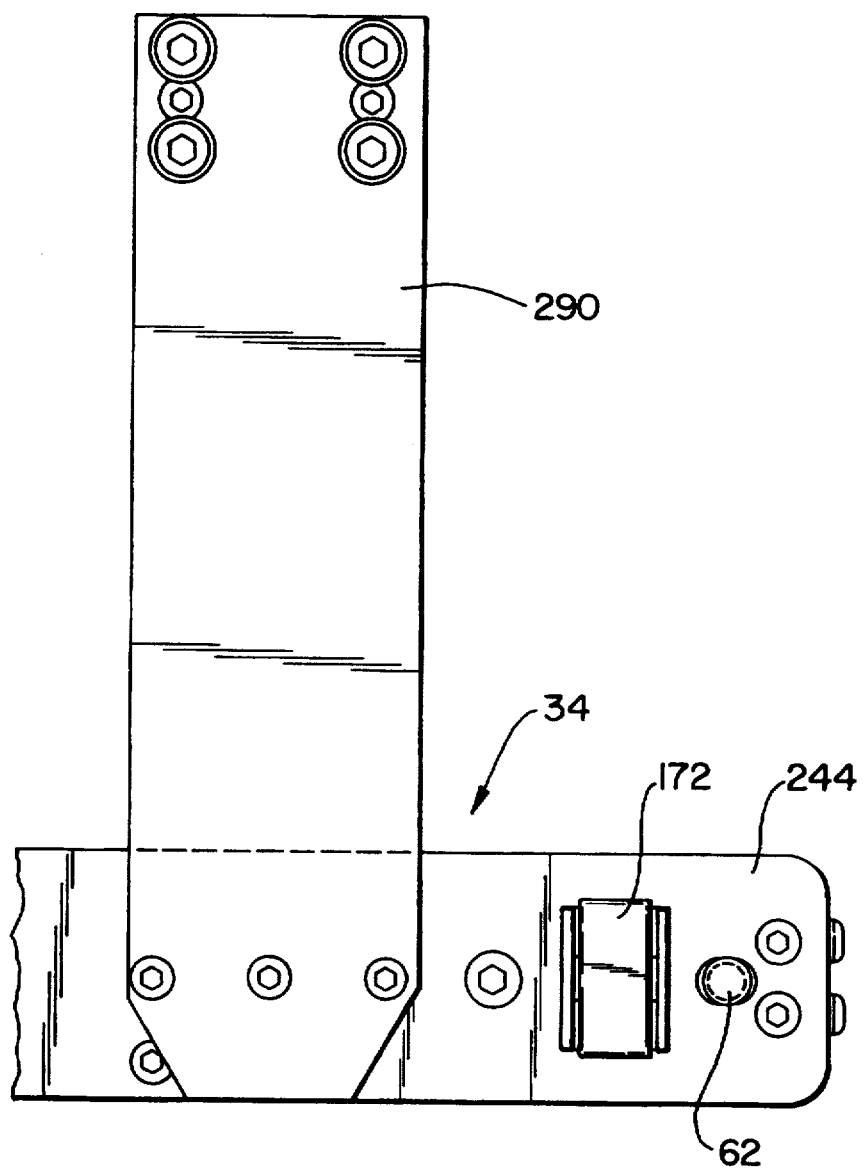
FIG. 13 is a top plan view of the embodiment of FIG. 11.
Figure 14:
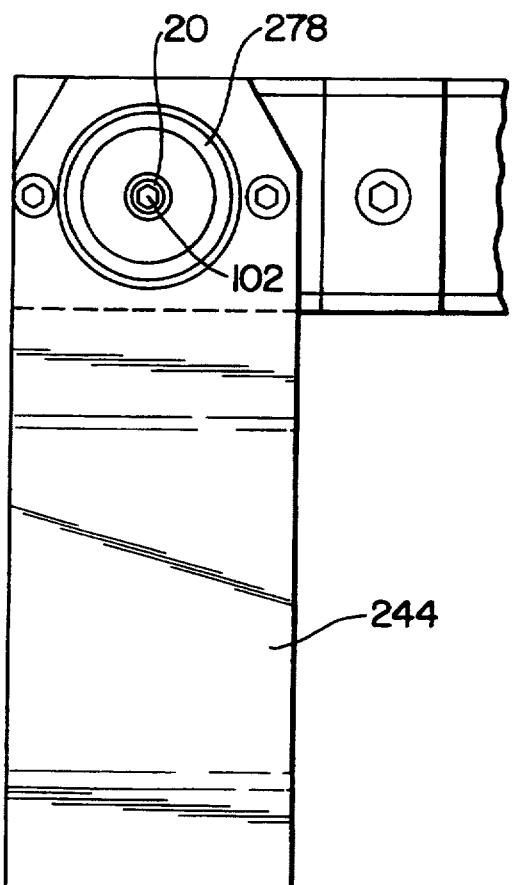
FIG. 14 is a bottom plan view.
Figure 15:
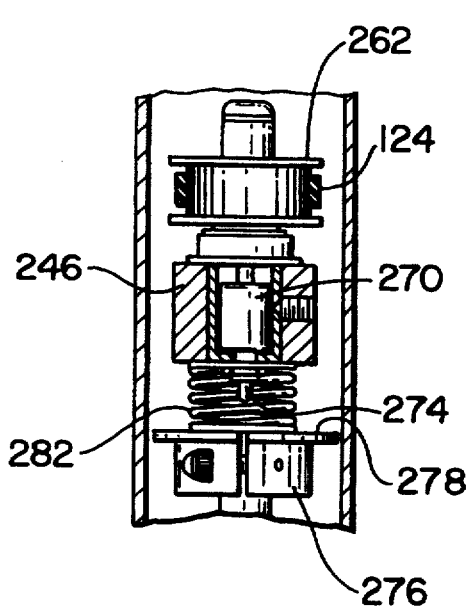
FIG. 15 is a partial section view taken along lines 15—15 in FIG. 12.

The carriage 34 is shown in top plan view in FIG. 13, and bottom plan view in FIG. 14. As shown in FIG. 13, the carriage 34, and in particular the spindle mounting structure, defines an L-shape in plan view, but its mounting holes and bolt holes are symmetrical about the axis of the pickup head 20, permitting reversal of the leg 290 of the L-shape. The clockspring 172 that balances the weight of the pickup head 20 and control plate 246 can be mounted with the spindle mechanism on the leg 290 of the L-shape that extends laterally. For a right handed person, the spindle 60 is placed on the right of the pickup head 20 as shown in solid lines in FIG. 13. The leg 290 of the L-shape can be demounted and readily placed on the left of the pickup head 20 for a left handed person, by detaching the leg 290 via the connecting bolts and remounting it on the left, as shown in FIG. 13 in broken lines. The bottom view of the carriage 34 shows that the bottom of the pickup head 20 faces downwardly toward the circuit board 22, and the extension leg 290 can extend to either side.

The embodiment of FIGS. 12–15 can also be provided with a hand support 50 (not shown). Alternatively, the carriage housing 294 defines a convenient place for the user to rest his or her hand while exerting translational forces on the carriage 34 and manipulating the pickup head 20 by raising, lowering and/or rotating it using the spindle 60.

The invention having been disclosed, variations within its scope will become apparent to persons aware of the structures and objects achieved by the foregoing embodiments of the invention. The invention is not intended to be limited to the exemplary embodiments shown, and also encompasses a reasonable range of variations and equivalents in accordance with the claims. Reference should be made to the appended claims rather than the foregoing examples in order to assess the scope of the invention in which exclusive rights are claimed.

Numerical

| | | | |
|---|---|---|---|
| 20 - | pickup head | 154 - | turret alignment opening |
| 22 - | circuit card | 162 - | picker rotation shaft end cap |
| 24 - | spring clamps | 164 - | vacuum switch operating shaft |
| 26 - | work area | 166 - | turret shaft compresssion spring |
| 28 - | supply of components - bin | 172 - | clockspring |
| 30 - | supply of components - tape | 180 - | fine support structure |
| 32 - | front area | 182 - | fine front/back vertical plates |
| 34 - | carriage | 184 - | fine guide shafts 1 |
| 36 - | turret | 186 - | fine intermediate sliding body |
| 42 - | telescoping arm | 188 - | fine bushings 1 |
| 44 - | sliding rail or bridge | 190 - | telescoping arm distal end |
| 48 - | rear of work area | 192 - | fine bushings 2 |
| 50 - | hand rest | 194 - | fine lateral shafts (2) |
| 52 - | table top | 196 - | fine lateral plates |
| 54 - | board vertical supports | 197 - | telescoping arm proximal end |
| 56 - | hand rest lateral support bracket | 198 - | lateral bridge |
| 60 - | picker rotation spindle | 199 - | bridge/arm bearings wheels |
| 62 - | spindle shaft | 224 - | bracket support for single picker |
| 64 - | spindle journal | 226 - | base block |
| 72 - | carriage fixed upper plate | 228 - | bracket support forward (high) end |
| 74 - | carriage fixed lower plate | 232 - | phantom slide shaft |
| 76 - | carriage support bar btw fixed plates | 234 - | support bar |
| 80 - | carriage intermediate plate | 242 - | sliding shaft |
| 82 - | fine translation mechanism | 244 - | upper and lower plates |
| 92 - | turret journals (upper & lower) | 246 - | single picker control plate |
| 94 - | turret shaft | 248 - | single picker bushings |
| 96 - | turret body | 252 - | single picker sliding shaft |
| 102 - | pickup head open bottom end | 255 - | single picker C-clasps |
| 110 - | vacuum fitting | 260 - | spindle handle |
| 112 - | vacuum control switch | 262 - | single picker pulleys |
| 120 - | operative picker location | 264 - | vacuum fitting to s.p. control plate |
| 122 - | picker rotation shaft | 268 - | bore in the pickup head |
| 124 - | rotation coupling belt | 270 - | switch s.p. |
| 126 - | rotation coupling pulleys | 274 - | pushbutton s.p. |
| 130 - | control plate | 276 - | switch contact member |
| 132 - | control plate bushings | 278 - | switch contact flange |
| 134 - | control plate slide shaft | 282 - | switch contact compression spring |
| 140 - | turret cup shaped bushing | 290 - | leg of L-shape |
| 142 - | turret cup radial pin | 294 - | carriage housing s.p. |
| 144 - | turret rosebud cam | | |
| 146 - | turret rosebud cam receptacles | | |
| 152 - | turret locking shaft | | |

Alphabetical

| | | | |
|---|---|---|---|
| 226 - | base block | 248 - | single picker bushings |
| 54 - | board vertical supports | 255 - | single picker C-clasps |
| 268 - | bore in the pickup head | 246 - | single picker control plate |
| 224 - | bracket support for single picker | 262 - | single picker pulleys |
| 228 - | bracket support forward (high) end | 252 - | single picker sliding shaft |
| 199 - | bridge/arm bearings wheels | 44 - | sliding rail or bridge |
| 34 - | carriage | 242 - | sliding shaft |
| 74 - | carriage fixed lower plate | 260 - | spindle handle |

-continued

| # | Name | # | Name |
|---|---|---|---|
| 72 - | carriage fixed upper plate | 64 - | spindle journal |
| 294 - | carriage housing s.p. | 62 - | spindle shaft |
| 80 - | carriage intermediate plate | 24 - | spring clamps |
| 76 - | carriage support bar btw fixed plates | 28 - | supply of components - bin |
| 22 - | circuit card | 30 - | supply of components - tape |
| 172 - | clockspring | 234 - | support bar |
| 130 - | control plate | 282 - | switch contact compression spring |
| 132 - | control plate bushings | 278 - | switch contact flange |
| 134 - | control plate slide shaft | 276 - | switch contact member |
| 188 - | fine bushings 1 | 270 - | switch s.p. |
| 192 - | fine bushings 2 | 52 - | table top |
| 182 - | fine front/back vertical plates | 42 - | telescoping arm |
| 184 - | fine guide shafts 1 | 190 - | telescoping arm distal end |
| 186 - | fine intermediate sliding body | 197 - | telescoping arm proximal end |
| 196 - | fine lateral plates | 36 - | turret |
| 194 - | fine lateral shafts (2) | 154 - | turret alignment opening |
| 180 - | fine support structure | 96 - | turret body |
| 82 - | fine translation mechanism | 142 - | turret cup radial pin |
| 32 - | front area | 140 - | turret cup shaped bushing |
| 50 - | hand rest | 92 - | turret journals (upper & lower) |
| 56 - | hand rest lateral support bracket | 152 - | turret locking shaft |
| 198 - | lateral bridge | 144 - | turret rosebud cam |
| 290 - | leg of L-shape | 146 - | turret rosebud cam receptacles |
| 120 - | operative picker location | 94 - | turret shaft |
| 232 - | phantom slide shaft | 166 - | turret shaft compression spring |
| 122 - | picker rotation shaft | 244 - | upper and lower plates |
| 162 - | picker rotation shaft end cap | 112 - | vacuum control switch |
| 60 - | picker rotation spindle | 110 - | vacuum fitting |
| 20 - | pickup head | 264 - | vacuum fitting to s.p. control plate |
| 102 - | pickup head open bottom end | 164 - | vacuum switch operating shaft |
| 274 - | pushbutton s.p. | 26 - | work area |
| 48 - | rear of work area | | |
| 124 - | rotation coupling belt | | |
| 126 - | rotation coupling pulleys | | |

We claim:

1. A pick and place apparatus for engaging and placing components on a circuit board, comprising:
   table means defining a work surface for receiving the circuit board;
   a carriage carrying at least one element for operating on the circuit board, and a movable support for the carriage, the movable support being freely movable by manual force and guiding the carriage in an plane parallel to the work surface, the movable support including coarse positioning means and fine positioning means, coupled between the table means and the carriage, the coarse and fine positioning means independently positioning the carriage and defining coarse and fine displacements that are added to one another for determining a position of the at least one element in the plane;
   wherein the coarse positioning means is coupled between the table means and the fine positioning means, and the fine positioning means is coupled between the coarse positioning means and the carriage; and,
   at least one control handle mounted on the carriage and arranged to move the element for operating on the circuit board, and a hand rest coupled to the coarse positioning means adjacent the carriage, the fine positioning means and the hand rest being positioned and dimensioned such that the control handle remains within finger range of an operator's hand on the hand rest, whereby an operator can use arm movements for coarse positioning by exertion of force on the hand rest, and finger movements for accurate operation of said element for operating on the circuit board.

2. The pick and place apparatus according to claim 1, wherein the hand rest is placed laterally of the carriage relative to an operator, and further comprising a demountable coupling for at least one of the hand rest and the control handle, and an alternative demountable coupling therefor, such that said at least one of the hand rest and the control handle is mountable on opposite lateral sides of the carriage to accommodate left handed and right handed operators.

3. The pick and place apparatus according to claim 2, wherein the coarse and fine positioning means each comprise independently operable guide structures, and in each independently operable guide structure is arranged in one of an X-Y positioning guide arrangement and a polar positioning guide arrangement.

4. The pick and place apparatus according to claim 3, wherein at least one of the coarse and fine positioning means comprises a forward/rearward guide structure and a side-to-side lateral guide structure, said forward-/rearward and side-to-side guide structures being mounted on one another for superimposing gross and fine positioning movements of the carriage.

5. The pick and place apparatus according to claim 2, wherein the coarse positioning means comprises at least one of a linearly displaceable and a rotatable arm, and the fine positioning means comprises a block coupled between the arm and the carriage, the fine positioning means comprising mutually perpendicular guide structures operable for fine positioning of the carriage within a span of finger movement of the operator, in a plane parallel to the work surface.

6. The pick and place apparatus according to claim 1, further comprising at least one receptacle for components to be placed on the circuit board, the at least one receptacle being movably mounted on the table means so as to pass over the circuit board, whereby the receptacle for the components can be placed in immediate proximity of the carriage, permitting short span movements for selecting components from the receptacle and placing the components on the circuit board.

7. The pick and place apparatus according to claim 1, further comprising a turret mounted on the carriage and a plurality of pickup heads forming the element for operating on the circuit board, the pickup heads being mounted in the turret for movement perpendicular to the work surface, the turret being rotatable and further comprising selectively operable means for manual control of a selected one of the pickup heads by the handle.

8. The pick and place apparatus according to claim 7, wherein each of the pickup heads has an associated means for coupling and decoupling the pickup head to a selected component, said means for coupling and decoupling being activated for a selected pickup head and remaining activated until said pickup head is again selected, whereby the turret can carry a plurality of components on respective said pickup heads.

9. The pick and place apparatus according to claim 8, wherein the means for coupling and decoupling the pickup head to a selected component comprises a controllable vacuum connection to the respective pickup head.

10. The pick and place apparatus according to claim 8, wherein the turret is rotatable for bringing the selected one of the pickup heads into an operative picker location around the turret, and wherein at least one of the handle and the means for coupling and decoupling the pickup head is arranged to operate only on a pickup head at the operative picker location.

11. The pick and place apparatus according to claim 10, further comprising a control plate mounted for movement in the carriage toward and away from the circuit board, the handle comprising a spindle fixed axially to the control plate and rotatable around a longitudinal axis of the spindle, and further comprising a contact member axially fixed to the control plate and rotatable around a longitudinal axis of the contact member, and a mechanical coupling for conveying rotation of the spindle to rotation of the contact member, the contact member defining the operative picker location and having a contact head operable to selectively engage a pickup head at the operative picker location when the control plate and the contact member thereon are advanced toward the work surface.

12. A pick and place apparatus for engaging and placing components on a circuit board, comprising:
 table means defining a work surface for receiving the circuit board;
 a carriage carrying at least one element for operating on the circuit board, and a movable support for the carriage, the movable support being freely movable by manual force and guiding the carriage in an plane parallel to the work surface, the movable support including coarse positioning means coupled to a hand rest arranged to support an operator's hand, and a fine positioning means coupled to the coarse positioning means for guiding movements of the element for operating on the circuit board relative to the hand rest, the fine positioning means and the hand rest being positioned and dimensioned such that the element for operating on the circuit board remains within range of an operator's hand on the hand rest, within a span of the fine positioning means.

13. The pick and place apparatus according to claim 12, wherein the coarse and fine positioning means each comprise independently operable guide structures, and each independently operable guide structure is arranged in one of an X-Y positioning guide arrangement and a polar positioning guide arrangement.

14. The pick and place apparatus according to claim 12, further comprising at least one receptacle for components to be placed on the circuit board, the at least one receptacle being movably mounted on the table means so as to pass over the circuit board, whereby the receptacle for the components can be placed in immediate proximity of the carriage, permitting short span movements for selecting components from the receptacle and placing the components on the circuit board.

15. The pick and place apparatus according to claim 12, wherein the hand rest extends laterally to one side relative to an operator, and further comprising a demountable coupling for the hand rest, and an alternative demountable coupling therefor for arranging the hand rest to extend laterally to an opposite lateral side.

16. A pick and place apparatus for picking components from a supply and placing the components on a circuit board, comprising:
 table means defining a work surface for receiving the circuit board;
 a carriage carrying at least one element for engaging and holding selected said components during transit from the supply to a placement location, and a movable support for the carriage, the movable support being freely movable by manual force and guiding the carriage in an plane parallel to the work surface;
 at least one receptacle for the components, the receptacle being supported on the table means by a movable support operable to hold the receptacle at a selected position over the circuit board, whereby the receptacle can be brought into proximity with the carriage for pick and place movements of the carriage over a short span of movement;
 a coarse positioning means operable to generally position the carriage over the circuit board and a fine positioning means coupled between the coarse positioning means and the carriage;.
 at least one control handle mounted on the carriage and arranged to move the element for operating on the circuit board, and a hand rest coupled to the coarse positioning means, the fine positioning means and the hand rest being positioned and dimensioned such that the control handle remains within finger range of an operator's hand on the hand rest, whereby an operator can use arm movements for coarse positioning by exertion of force on the hand rest, and wherein the fine positioning means defines a span of fine positioning movement relative to the coarse positioning means that permits an operator to displace the carriage via finger movements of a hand supported on the hand rest.

17. The pick and place apparatus according to claim 16, wherein the coarse and fine positioning means each comprise independently operable guide structures, and each independently operable guide structure is arranged in one of an X-Y positioning guide arrangement and a polar positioning guide arrangement.

18. The pick and place apparatus according to claim 16, wherein the hand rest is placed laterally of the carriage relative to an operator, and further comprising a demountable coupling for at least one of the hand rest and the control handle, and an alternative demountable coupling therefor, such that said at least one of the hand rest and the control handle is mountable on opposite lateral sides of the carriage to accommodate left handed and right handed operators.

19. The pick and place apparatus according to claim 14, wherein said element comprises a turret mounted on the carriage and a plurality of pickup heads for engaging the components, the pickup heads being selectable and individually movable under operator control to extract components from the supply and to carry the components to the positions selected by the operator; and,
 wherein each of the pickup heads has an associated individually controlled engagement means that is activatable under control of the operator to engage the components, and thereafter to hold the components during selection of others of the pickup heads, whereby the operator can store a plurality of components by engaging the components with selected pickup heads in the turret.

20. The pick and place apparatus according to claim 19, wherein the engagement means comprises a vacuum source and at least one switch for each of the pickup heads, the switch being alternately acting for coupling and decoupling the vacuum source to the pickup head during successive selection of the respective pickup head from among the plurality of pickup heads in the turret.

* * * * *